United States Patent [19]
Chu et al.

[11] Patent Number: 5,953,930
[45] Date of Patent: Sep. 21, 1999

[54] EVAPORATOR FOR USE IN AN EXTENDED AIR COOLING SYSTEM FOR ELECTRONIC COMPONENTS

[75] Inventors: Richard C. Chu, Poughkeepsie, N.Y.; Gregory M. Chrysler, Chandler, Ariz.

[73] Assignee: International Business Machines Corporation, Armonk, N.Y.

[21] Appl. No.: 09/052,416

[22] Filed: Mar. 31, 1998

[51] Int. Cl.$^6$ .............................. F25D 23/12; F28D 15/00
[52] U.S. Cl. .................. 62/259.2; 361/700; 165/104.21; 165/104.33
[58] Field of Search .................................. 62/259.2, 515, 62/DIG. 22; 165/104.21, 104.33; 361/700

[56] References Cited

U.S. PATENT DOCUMENTS

| | | | |
|---|---|---|---|
| 3,317,798 | 5/1967 | Chu et al. | 317/100 |
| 3,387,648 | 6/1968 | Ward et al. | 165/104.33 |
| 4,602,679 | 7/1986 | Edelstein et al. | 165/104.26 |
| 4,793,405 | 12/1988 | Diggelmann et al. | 165/104.33 |
| 5,003,376 | 3/1991 | Iversen | 357/82 |
| 5,063,475 | 11/1991 | Balan | 361/384 |
| 5,077,601 | 12/1991 | Hatada et al. | 357/81 |
| 5,150,278 | 9/1992 | Lynes et al. | 361/386 |
| 5,329,425 | 7/1994 | Leyssens et al. | 361/701 |
| 5,361,188 | 11/1994 | Kondou et al. | 361/695 |
| 5,513,071 | 4/1996 | LaViolette et al. | 361/703 |
| 5,587,880 | 12/1996 | Phillips et al. | 361/687 |
| 5,613,552 | 3/1997 | Osakabe et al. | 165/104.21 |

FOREIGN PATENT DOCUMENTS 9-69595  3/1997  Japan .

OTHER PUBLICATIONS

Chrysler et al., "Enhanced Thermosyphon Cooling System," IBM Technical Disclosure Bulletin vol. 37, No. 10, Oct. 1994, pp. 11–12.

Primary Examiner—William Doerrler
Attorney, Agent, or Firm—Lawrence D. Cutter; Heslin & Rothenberg, P.C.

[57] ABSTRACT

A thermosyphon system employs a flat evaporator which is matched to its function of cooling vertically oriented electronic circuit modules. The evaporator is connected in a thermosyphon system which facilitates air cooling and the closer spacing of electronic components whose immediate volume region is not occupied by cooling system components. The evaporator is configured to provide a uniform flow of fluid returned to it to avoid module hot spots.

6 Claims, 4 Drawing Sheets

EVAPORATOR FOR USE IN AN EXTENDED AIR COOLING SYSTEM FOR ELECTRONIC COMPONENTS

BACKGROUND OF THE INVENTION

The present invention is generally directed to a system for cooling electronic circuit components. In one aspect of the invention, an evaporator plate is provided which ensures uniform component cooling. In another aspect of the present invention, there is provided a thermosyphon cooling system which provides a cooling mechanism while, at the same time, permitting close and compact placement of electronic circuit chip modules. In yet another aspect of the present invention, there is provided a cooled, compact electronic system which permits placement of electronic modules in a dense configuration within the central portion of a computer frame assembly while, at the same time, providing air cooling capability in spite of the component density and access difficulty.

In various electrical and electronic systems, certain designs result in the generation of significant amounts of thermal energy which must be removed in order for the system to continue to function. When these systems are data processing devices, it is noted that the thermal load that results is also a function of the frequency at which the device is operated. For example, it is well known that a doubling in the frequency at which a device operates generally produces a doubling in the amount of heat which must be removed from the system.

Accordingly, as systems, particularly computer systems, are driven to operate at ever-increasing speeds, there is a corresponding need to provide improved cooling systems for these systems. Even more particularly with respect to data processing systems, their speed of operation is dependent upon providing short signal paths between various modules, chips and components. Accordingly, it is seen to be very desirable to place computer processing modules in relatively close proximity to one another and to memory modules. However, close and compact configurations of these modules can render it difficult to provide air-cooling capabilities especially when a relatively hot processing unit is surrounded by other peripheral components to which it is attached in a manner which provides as short a set of signal paths as is possible.

Accordingly, it is seen that it is very desirable to be able to cool computer systems in a manner which still permits close packaging of their electronic component modules and still maintain compatibility with frame size and with the thermal capabilities of various computer installations. It is also noted that this cooling should be provided in a manner which is effective yet reliable over relatively long periods of time, particularly when such systems are used in on-line transaction processing environments.

One of the ways proposed herein for cooling such systems is through the utilization of thermosyphon-based cooling units. Such units typically employ evaporators which are oriented in a vertical direction corresponding to placement of electronic modules within the system. Vertical placement is decidedly preferred in such systems since vertical module orientation facilitates any convectional cooling that occurs. However, this vertical placement forces the evaporator fins to be quite long and, accordingly, it is seen that the vertical orientation sometimes can result in the drying out of the coolant liquid at upper internal regions of the evaporator thus rendering that portion of the evaporator somewhat ineffective for its desired cooling purposes.

SUMMARY OF THE INVENTION

In accordance with one embodiment of the present invention, a cooling system for electrical or electronic equipment is provided which includes a substantially flat evaporator which has a thermally conductive surface for direct and immediate contact with the electrical equipment which is to be cooled. A condenser which is disposed above and sufficiently far away from the evaporator so as to avoid interference with close placement of separately cooled portions of the electronic or electrical equipment is likewise provided in a thermosyphon system. A vapor line extends from an upper portion of the evaporator to an upper portion of the condenser. Similarly, a return line extends from a lower portion of the condenser to a lower portion of the evaporator. This permits liquid coolant converted to vapor in the evaporator to be introduced into the condenser where it is cooled, condensed and is returned as a liquid which flows back to the evaporator in a closed loop fashion. In preferred embodiments of the present invention, there is also provided an air-moving device (AMD) such as a fan for removing heat from the condenser. In lower power applications, natural convection through the condenser may be employed.

In another aspect of the present invention, the thermosyphon system described above includes an evaporator plate which is particularly effective for ensuring that coolant is not boiled away entirely from any region of the evaporator. In particular, the evaporator includes a substantially flat, sealable housing with an inlet on its lower portion and an outlet disposed on an upper portion of the housing. This housing includes a thermally conductive outer surface (preferably flat) for direct thermal contact with a body, object or equipment to be cooled. Within the housing itself, a first internal conduit extends substantially upwardly from the inlet port. A second internal conduit extends substantially downwardly from the cutlet port on the opposite side of the housing. Additionally, there is also included within the housing a plurality of substantially horizontally oriented individual evaporation chambers which are in flow communication between the first conduit on one side of the housing and the second conduit on the opposite side of the housing. These evaporation chambers provide connections between the internal conduits so as to provide flow communication across the evaporator and the housing. Additionally, it is noted that the connections to the conduits are such that the connection to the first conduit is very much preferably located below the connection to the second conduit. The evaporator plate also preferably includes a sequence of substantially parallel baffles within at least one of the individual evaporation chambers (and preferably in all of them). These baffles assist in ensuring a uniform distribution of liquid phase coolant throughout the entire evaporator and its housing so as to ensure uniform cooling of the thermally conductive outer surface of the housing. This, therefore, ensures that the devices to be cooled are in fact cooled uniformly. Additionally, it is noted that the baffles may also be configured in a custom fashion to ensure the flow of liquid coolant to regions having chip "hot spots."

In yet another aspect of the present invention, the thermosyphon system and evaporator plate described above are employed in conjunction with a structural frame which supports one or more printed circuit boards. At least one of these printed circuit boards has electronic modules, which are to be cooled, disposed on it. An evaporator is disposed in thermal contact with the module and a condenser is disposed within or on the frame in a position above the evaporator. A vapor line extends from an upper portion of the evaporator to an upper portion of the condenser. A condensate (return) line extends from a lower portion of the condenser to a lower portion of the evaporator. The evaporator, the condenser, the vapor line and the condensate line form a closed loop for containing a coolant fluid. An air-moving device is provided for removing heat from the condenser. The frame members provide support, concealment and/or protection for either or both of the vapor and condensate lines.

The cooling system described above has the particular advantage that it typically requires no moving parts other than the air-moving device which moves a cooling flow of air over and/or through the condenser.

Accordingly, it is an object of the present invention to provide a cooling system for electronic modules in a fashion which permits close, vertical module placement.

It is also an object of the present invention to provide a cooling system which employs air cooling but which does not require the presence of bulky, space-consuming air-moving devices to be present in the immediate vicinity of the electronic modules.

It is also an object of the present invention to provide an evaporator plate for which the problem of localized coolant dry spots is significantly ameliorated.

It is a still further object of the present invention to eliminate the need for pump-based water cooling systems which often require auxiliary plumbing devices such as expansion tanks.

It is a still further object of the present invention to reduce the volume of cooling hardware which is required immediately adjacent to electronic modules to be cooled so as to therefore reduce the board or card pitch (in the linear density sense) thus leading to enhanced processor and system operation speeds.

It is also an object of the present invention to provide a cooling system which is relatively insensitive to module power variations.

It is a still further object of the present invention to reduce the number of mechanical and/or moving devices associated with a cooling system for data processing equipment.

It is also another object of the present invention to provide a mechanism for operation of data processing and the like equipment at increased speeds and frequencies.

It is a still further object of the present invention to take advantage of the simplicity of thermosyphon-operating characteristics.

It is yet another object of the present invention to provide a closed and sealable thermosyphon cooling system which can be partially filled with a coolant liquid and vapor phase materials which are maintained at subatmospheric pressures to facilitate conversion to the vapor phase at a lower temperature.

It is also an object of the present invention to provide a cooling system which is operable using simple and uncomplicated coolants such as water and/or mixtures of water and alcohol, fluorocarbons and/or, much less preferably, chlorofluorocarbons.

It is also an object of the present invention to provide a packaging arrangement for data processing equipment which includes thermosyphon heat removal means.

It is also an object of the present invention to provide packaging for electronic and/or electrical equipment which is packagable in standard frame and cabinet arrangements and which provide heat rejection and removal arrangements which are located at relatively exterior portions of the frame cabinetry.

It is a still further object of the present invention to provide a cooling system which permits the placement of printed circuit boards at relatively closely spaced intervals to one another, particularly in a standard cabinet and frame package.

It is also an object of the present invention to provide a cooling system wherein coolant is driven in a closed loop around the system solely by action of gravity and the density difference between liquid and vapor phases.

Lastly, but not limited hereto, it is an object of the present invention to enhance the thermal characteristics of vertically oriented evaporators.

BRIEF DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DETAILED DESCRIPTION OF THE INVENTION

Figure 1A:
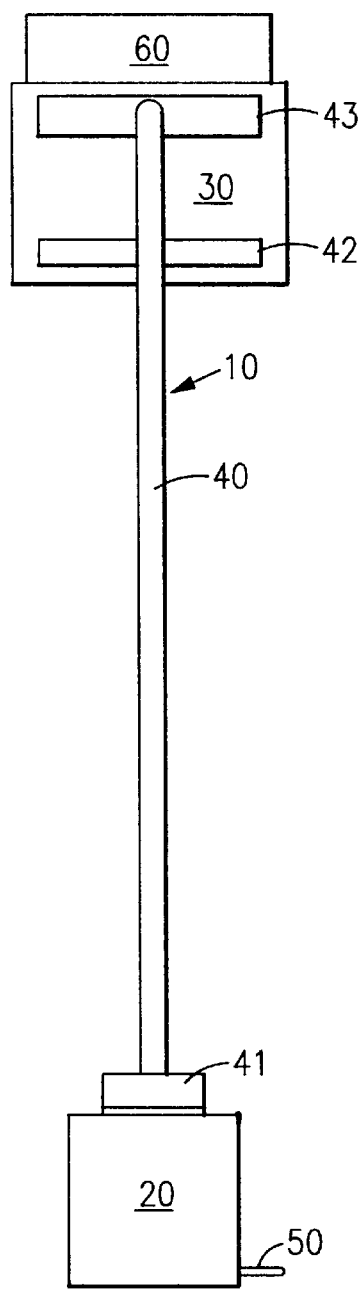
FIG. 1A is a rear elevation view illustrating a thermosyphon system employable in the present invention.

FIG. 1A illustrates a thermosyphon arrangement which is particularly useful for employing the evaporator of the present invention. In particular, thermosyphon system 10 shown in FIG. 1A includes evaporator 20 which discharges vapor phase coolant into vapor discharge plenum 41 from evaporator 20. Plenum 41 preferably comprises a cylindrical central section having a rectangular entrance port and a cylindrical exit port which feeds directly into flexible vapor line 40. Vapor line 40 supplies a similarly constructed vapor plenum 43 as a supply input to condenser 30. Condenser 30 removes heat from the vapor phase coolant and produces liquid condensate material which flows into liquid plenum 42 and thence to liquid condensate return line 50 which is connected to a lower portion of evaporator 20. In this way, electronic module 70 is cooled by the boiling action of coolant within evaporator 20.

Figure 1B:
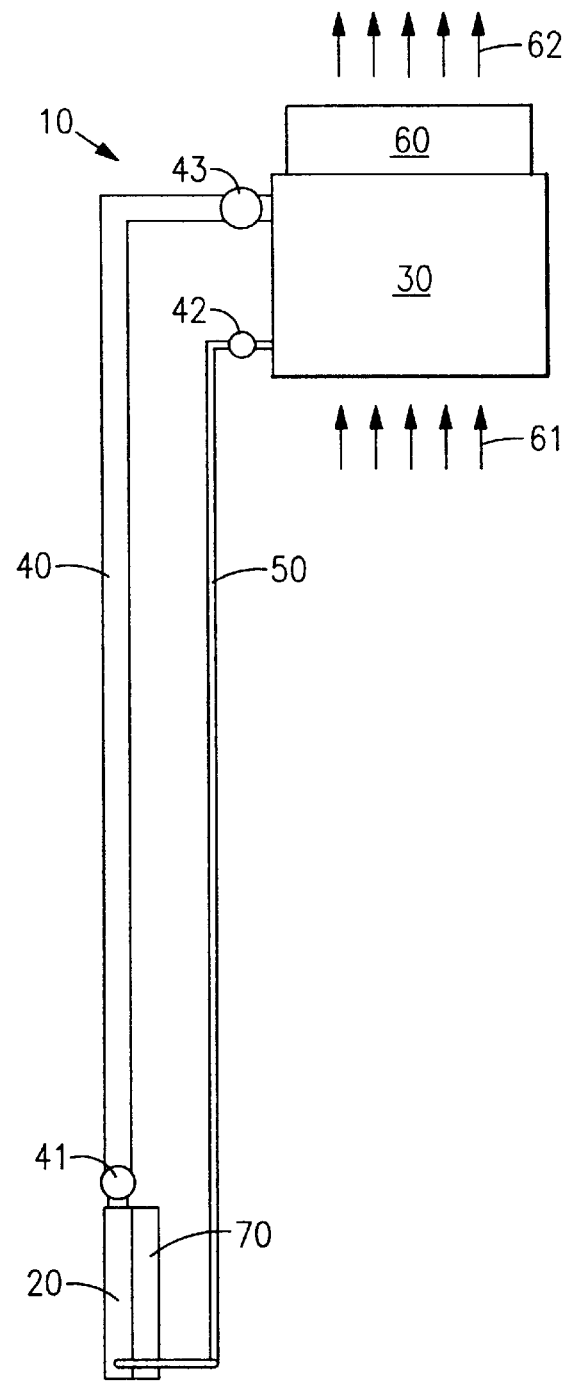
FIG. 1B is a side elevation view of the thermosyphon system seen in FIG. 1A.

Furthermore, FIG. 1B illustrates the inclusion of air-moving device 60 which moves air through condenser 30 to provide a heat rejection mechanism to the atmosphere, as illustrated by air flow lines 61 and 62.

Figure 2:
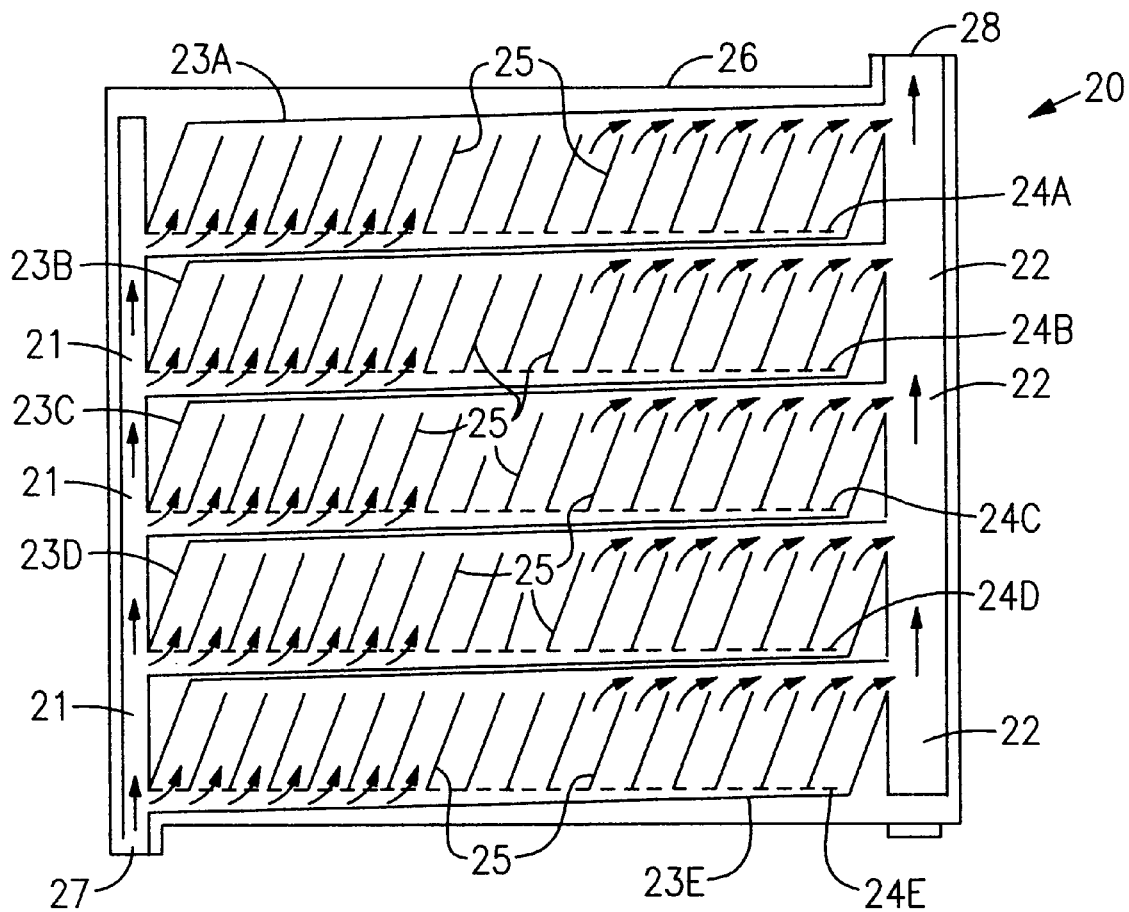
FIG. 2 is a front cross-sectional view illustrating the interior of an evaporator used in preferred embodiments of the present invention.

FIG. 2 provides a more detailed view of an evaporator which is especially useful in the thermosyphon cooling system of the present invention. In particular, evaporator 20 includes housing 26 having a substantially flat exterior portion which is in direct thermal contact with the electronic module to be cooled. This surface does not have to be flat; it could conform to the object to be cooled. However, design economies and convenience certainly dictate that the flat design is the preferable choice for the configuration of housing 26.

Within housing 26, there is provided a first (liquid phase) conduit 21 which receives return flow from condenser 30 through condensate return line 50 via inlet port 27. Likewise, housing 26 includes a second (vapor phase) conduit 22 which extends downwardly from outlet port 28 positioned on an upper portion of housing 26. The positioning of inlet port 27 and outlet port 28 is meant to facilitate the gravitationally induced flow of coolant through evaporator 23. Of particular importance herein is the presence of evaporator chambers 23A through 23E each of which extends between conduits 21 and 22. These evaporator chambers further include canted baffles 25 which serve to direct the flow of coolant in a uniform manner toward the connections that chambers 23A through 23E have with vapor phase conduit 22. Additionally, it is noted that chambers 23A through 23E include perforated plates 24A through 24E disposed in their respective evaporation chambers. Plates 24A through 24E and baffles 25 serve to provide a more uniform flow of coolant through evaporator 20. In this way, the chances are reduced that a particular point within the evaporator becomes "dry" in the sense that coolant is converted entirely into the vapor phase which, therefore, does not thoroughly wet the thermally conductive surface provided for module cooling.

During the boiling process within the evaporator chambers 23A through 23E, liquid may be entrained within the vapor produced. However, by properly sizing vapor conduit 22, it is possible to provide a relatively low vapor velocity to ensure that only vapor phase material leaves evaporator 20. Additionally, vapor pressure within the thermosyphon system is preferably maintained at a level such that boiling of liquid in the system takes place at a temperature which is at or below an operation range for the particular electronics module(s) being cooled.

Figure 3:
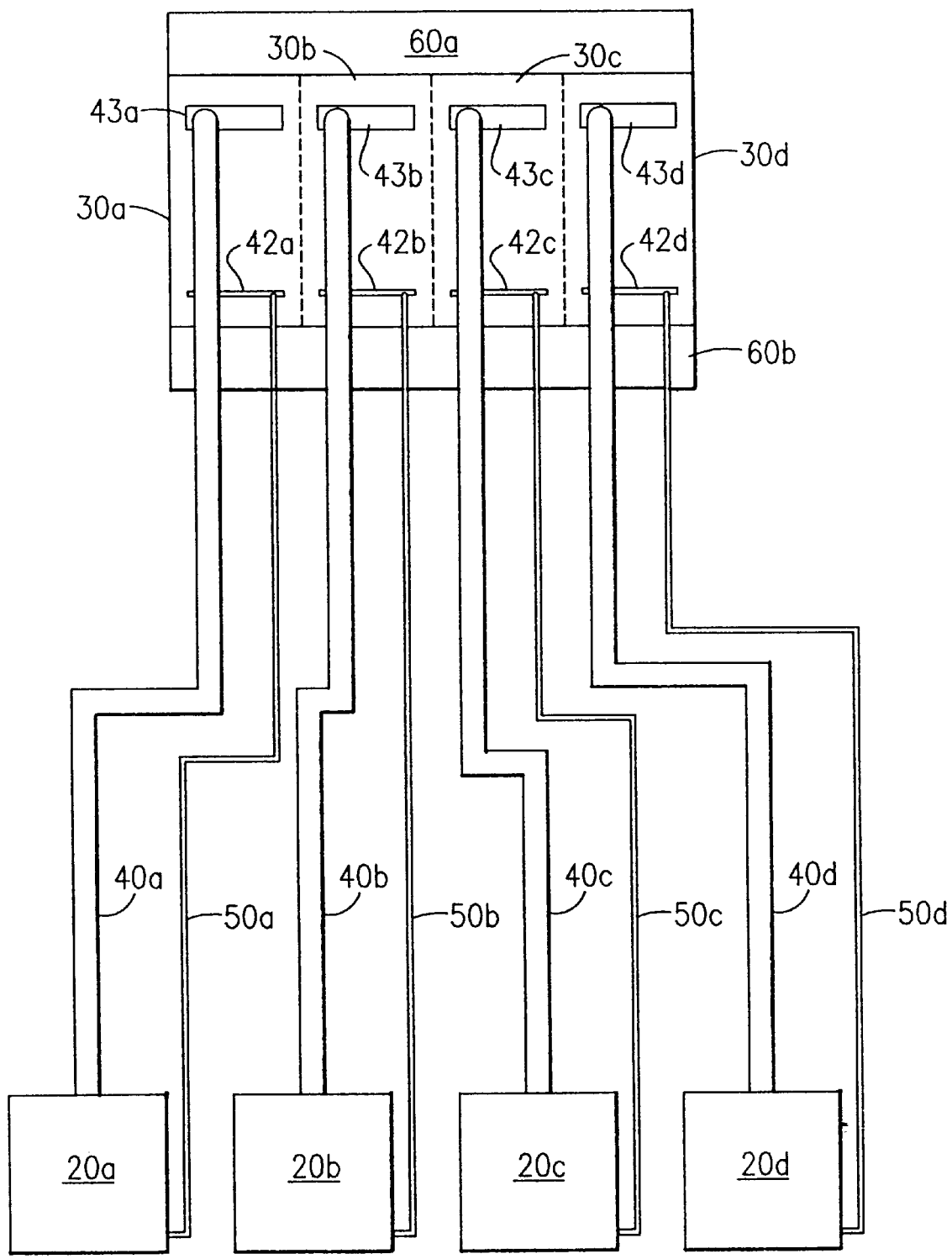
FIG. 3 is a rear elevation view illustrating the arrangement of thermosyphon cooling systems in the present invention in the circumstance in which multiple modules are to be cooled.

FIG. 3 illustrates an arrangement of modular thermosyphon systems employed for cooling a plurality of separate electronic modules. These thermosyphon systems are substantially as shown in FIG. 1 except that, in FIG. 3 as shown, separate portions have been designated by adding a lower case alphabetic character, namely, a, b, c or d, to the reference numeral employed for the corresponding single system version shown in FIG. 1. However, it is to be particularly noted that condenser 30 includes four condenser portions, 30a through 30d, all of which are cooled by means of two air-moving devices, fan 60a and fan 60b, configured to operate in a push-pull configuration. This means that one air-moving device pulls air through the condenser while the other air-moving device pushes air through the condenser. This arrangement is advantageous in the event that one of the air-moving devices fails, there is nonetheless continued operability due to the on-going operation of the other air-moving device. By appropriately designing the capacity of the thermosyphon heat removal system, operation using only a single air-moving device is possible but long-term continued operation may in fact be a function of the thermal load being generated by the individual electronic modules.

Figure 4:
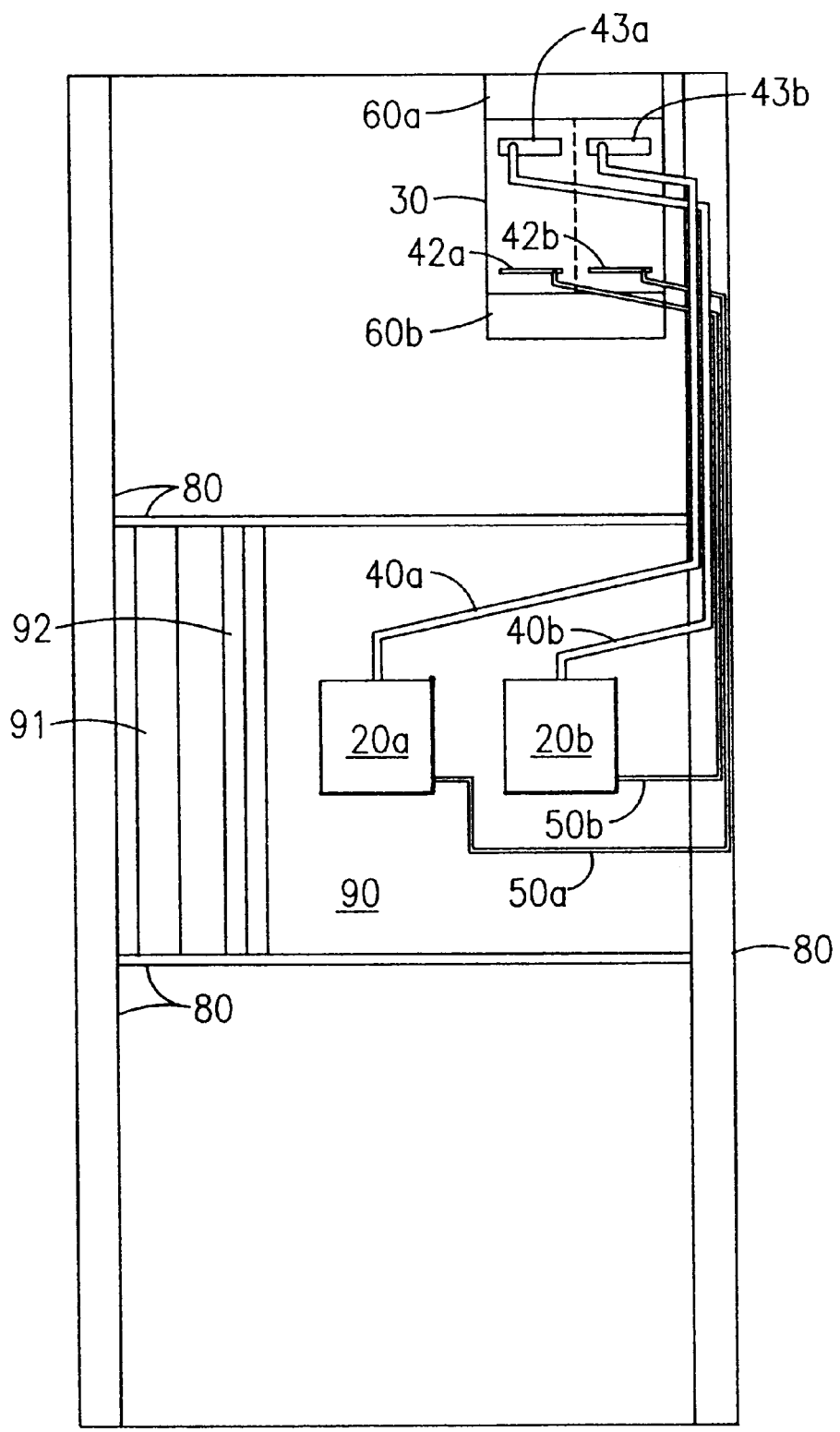
FIG. 4 is a rear elevation view illustrating the employment of the cooling system of the present invention in a frame and cabinet for a data processing system.

FIG. 4 illustrates, in rear elevation view format, the thermosyphon system of the present invention being employed to cool two electronic modules (not visible) disposed on printed circuit board 90. Other printed circuit boards may also be disposed within frame 80 mounted in a fashion substantially parallel to printed circuit board 90. Other circuit boards 91 and 92 may also be disposed within frame 80 in a direction substantially orthogonal to circuit board 90. These boards may include other electronic components which are not heat critical. Of particular note is the fact that, in FIG. 4, condenser 30 is disposed in a position which is removed from the central portion of the frame and yet which is nonetheless positioned at a location from which heated air is readily employed as the mechanism for removing heat from condenser 30.

It is also noted that, in FIG. 2, the liquid supply section feeding evaporator chambers 23A through 23E is preferably tapered in the horizontal direction. The tapering of the liquid supply, together with perforated flow control plates 24A through 24E, ensures that liquid coolant is uniformly distributed to the surfaces of fins 25 for boiling. Likewise, above the fins, there is provided a tapered vapor channel which feeds vapor conduit 22.

The actual routing of the vapor and condensate lines are as preferably shown in FIG. 4. Because of the highly effective nature of boiling heat transfer, the vapor line does not need to be very large. A flexible line carrying the vapor from the evaporator to the condenser is routed through the supporting structure of the frame. The even smaller condensate line is also tucked out of the way in structural parts.

Accordingly, it is seen that the present invention solves several problems including the elimination of redundant pumps which are generally required for coolant circulation. Additionally, there is eliminated any need for an expansion tank. However, importantly, the cooling system described herein reduces the volume of cooling hardware which is required in the volume immediately adjacent to the electronics and, therefore, is seen to reduce the board or card pitch which therefore leads to closer spacing of processor boards. Additionally, it is seen that the apparatus shown herein provides a cooling system which is relatively insensitive to module power variations and, additionally, provides the capability of higher processor performance and shorter signal paths. In addition, it is seen that all of the objects cited above are in fact met by the cooling system and apparatus described herein.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. An evaporator plate for use in a thermosyphon cooling system, said plate comprising:

a substantially flat, sealable housing having an inlet port disposed on a lower portion thereof and an outlet port disposed on an upper portion thereof; and also including a thermally conductive outer surface for thermal contact with a body to be cooled;

a first internal conduit extending substantially upwardly from said inlet port;

a second internal conduit extending substantially downwardly from said outlet port;

a plurality of substantially horizontally oriented evaporation chambers having connections so that said chambers are connected to said internal conduits in flow communication between said first conduit on one side of said evaporator plate and said second conduit on the opposite of said evaporator plate and wherein said connections to said conduits are such that the connection to said first conduit is below the connection to said second conduit.

2. The evaporator plate of claim 1 in which the first conduit is sized as a passage for liquid phase coolant.

3. The evaporator plate of claim 1 in which the second conduit is sized as a passage for vapor phase coolant.

4. The evaporator plate of claim 1 further including a sequence of substantially parallel baffles within at least one of said evaporation chambers.

5. The evaporator plate of claim 4 in which said baffles are oriented in a canted position so as to direct flow of coolant toward said second conduit connections.

6. The evaporator plate of claim 1 further including a perforated plate disposed in at least one of said chambers beneath said baffles so as to make coolant flow within said chambers more uniform.

* * * * *